(12) United States Patent
Emer

(10) Patent No.: US 7,965,377 B2
(45) Date of Patent: Jun. 21, 2011

(54) METHOD FOR ADJUSTING A PROJECTION OBJECTIVE

(75) Inventor: Wolfgang Emer, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 510 days.

(21) Appl. No.: 12/060,543

(22) Filed: Apr. 1, 2008

(65) Prior Publication Data

US 2008/0192220 A1    Aug. 14, 2008

Related U.S. Application Data

(63) Continuation of application No. 11/102,102, filed on Apr. 8, 2005, now Pat. No. 7,372,545.

(60) Provisional application No. 60/560,623, filed on Apr. 9, 2004.

(30) Foreign Application Priority Data

Jul. 22, 2004   (DE) .......................... 10 2004 035 595

(51) Int. Cl.
*G03B 27/52* (2006.01)
*G03B 27/42* (2006.01)
*G03B 27/68* (2006.01)

(52) U.S. Cl. .............................. 355/55; 355/52; 355/53
(58) Field of Classification Search ................... 355/52, 355/53, 55, 67, 77; 250/548
See application file for complete search history.

(56) References Cited

U.S. PATENT DOCUMENTS

| 4,920,505 | A | * | 4/1990 | Suzuki ........................... 399/51 |
| 5,973,863 | A |   | 10/1999 | Hatasawa et al. |
| 6,879,381 | B2 | * | 4/2005 | Kenmoku ....................... 355/55 |
| 6,961,115 | B2 |   | 11/2005 | Hamatani et al. |
| 7,075,651 | B2 | * | 7/2006 | Tsukakoshi ................... 356/399 |
| 7,405,803 | B2 | * | 7/2008 | Shimizu et al. ................. 355/52 |
| 2002/0001088 | A1 |   | 1/2002 | Wegmann et al. |
| 2004/0042094 | A1 |   | 3/2004 | Matsuyama |

FOREIGN PATENT DOCUMENTS

EP         1 231 516 A1     8/2002
* cited by examiner

*Primary Examiner* — Hung Henry Nguyen
(74) *Attorney, Agent, or Firm* — Fish & Richardson P.C.

(57) ABSTRACT

A projection objective having a number of adjustable optical elements is optimized with respect to a number of aberrations by specifying a set of parameters describing imaging properties of the objective, each parameter in the set having an absolute value at each of a plurality of field points in an image plane of the projection objective. At least one of the optical elements is adjusted such that for each of the parameters in the set, the field maximum of its absolute value is minimized.

42 Claims, 3 Drawing Sheets

METHOD FOR ADJUSTING A PROJECTION OBJECTIVE

CROSS-REFERENCE TO RELATED APPLICATIONS

This is a continuation of, and claims priority under 35 U.S.C. §120 to, U.S. application Ser. No. 11/102,102 filed Apr. 8, 2005 which, in turn claims priority under 35 U.S.C. §119(e) to U.S. Provisional Application Ser. No. 60/560,623 filed Apr. 9, 2004 and under 35 U.S.C. §119 to German Patent Application No. DE 10 2004 035 595.9 filed Jul. 22, 2004.

BACKGROUND OF THE INVENTION

1. Field of the Invention

The invention relates to a method for adjusting a projection objective of a projection exposure machine for microlithography for the purpose of fabricating semiconductor components having a number of optical elements, which can be set via manipulators, for simultaneously minimizing a number of aberrations of the projection objective, the minimization of the aberrations being carried out by manipulating at least one portion of the optical elements with the aid of their respective manipulators.

2. Description of the Prior Art

EP 1 231 516 A2 discloses a method for specifying, fabricating and adjusting a projection objective. For the specification, that is to say the description of the optical properties of the projection objective, use is made in this case of a description of the transmission function of the objective pupil for a number of field points. Field points represent a specific position in the object or image plane of the projection objective. The scalar transmission function of the objective pupil can be specified for each field point in the form of a two-dimensional complex variable. The phase of this complex variable is also denoted wave aberration. EP 1 231 516 A2 describes these wave aberrations for each field point by means of so-called Zernike coefficients. Consequently, the image-forming properties of the projection objective are likewise specified by the specification of these Zernike coefficients.

In order to ensure optimum use of the projection objective in a projection exposure machine for microlithography, for example for the purpose of fabricating semiconductor components, the above-described specification of the image-forming properties of the projection objective is very important—although, of course, in addition to accurate knowledge relating to the lithographic process to be carried out with the aid of the projection exposure machine (illumination, precision of the structures to be exposed, photo-resist process, etc.). In general, it is not only a single lithographic process which is relevant, but rather it must even be possible to carry out a multiplicity of various lithographic processes with the aid of the projection objective. In order for it to be possible to find a relationship between this multiplicity of lithographic processes and the properties of the projection objective, their most general description of the image-forming properties of the projection objective is sensible.

The relationship between the objective properties and the lithographic process is established in EP 1 231 516 A2 with the aid of these Zernike coefficients. This can be accomplished in many cases with the aid of a linear model, given the assumption of sufficiently small aberrations.

Following on from the fabrication of a projection objective, a concluding optimization by means of the manipulators (xy-manipulation, tilt manipulation, z-manipulation, wavelength, gas pressure or reticle tilt and reticle height) of the optical elements located in the projection objective is important in deciding the final image forming quality or the image-forming properties of the projection objective.

It is known to introduce slight changes in the optical properties by measuring parameters for which the effects of the manipulation for the optical elements on these parameters are known, whereupon optimization of the parameters is carried out. As described at the beginning, Zernike coefficients which describe the image-forming properties of the projection objective are determined as a rule for this purpose from measured values. This is achieved, for example, by means of measurements at a number of field points in the field, relevant for lithographic imaging, in the image plane of the projection objective. Zernike coefficients with designations $Z_2$ to $Z_{37}$ are determined in this way (compare EP 1 231 516 A2), after which the optimization is performed. The average root-mean-square deviation of all the measured field points from 0 is minimized for this purpose in the case of each Zernike coefficient (so-called least square optimization).

SUMMARY OF THE INVENTION

The present invention is based on the object of further improving a method of the type mentioned at the beginning; in particular, the aim is to specify the image-forming properties of the projection objective as faithfully as possible to reality.

This object is achieved according to the invention by virtue of the fact that the adjustment is carried out by means of min-max optimization of a number of parameters, suitable for describing the imaging properties of the projection objective, at various field points of an image plane of the projection objective, as a result of which the individual parameters are optimized in such a way that the parameter value of the field point which has the maximum aberration is optimized, that is to say is generally minimized or at least reduced.

The min-max optimization is also denoted synonymously as minimax optimization. The measures according to the invention provide greatly improved concepts for adjusting lithography objectives and for optimizing their manipulators. The use of the nonlinear min-max optimization is advantageous in particular when the field maximum of the Zernike coefficients is used to specify the image-forming quality of the projection objective, since the min-max optimization optimizes precisely this field maximum. A min-max optimization of a projection objective is understood to be the optimization of a set of parameters at various field points in the image plane of the projection objective. Each individual parameter is optimized in this case such that the worst value of all the field points is optimal. Since it is not initially established at which field point this worst value occurs, this optimization is a nonlinear method for whose solution known numerical methods can be used. The various parameters can feature in the optimization with different weightings. Moreover, it is possible to introduce secondary conditions in order, for example, to limit the maximum traverse paths of the manipulators. It is conceivable, furthermore, to combine a number of field points, in which case a parameter at a field point is replaced by a function of this parameter at a number of field points.

Possible as parameters are, for example, individual Zernike coefficients to describe the wave aberrations in the objective pupil.

Also conceivable as parameter is a linear combination of Zernike coefficients which describes lithographically important variables such as distortion or structure width.

Advantageous refinements and developments of the invention follow from the dependent claims. Exemplary embodiments are described in principle below with the aid of the drawing.

DETAILED DESCRIPTION

Figure 1:
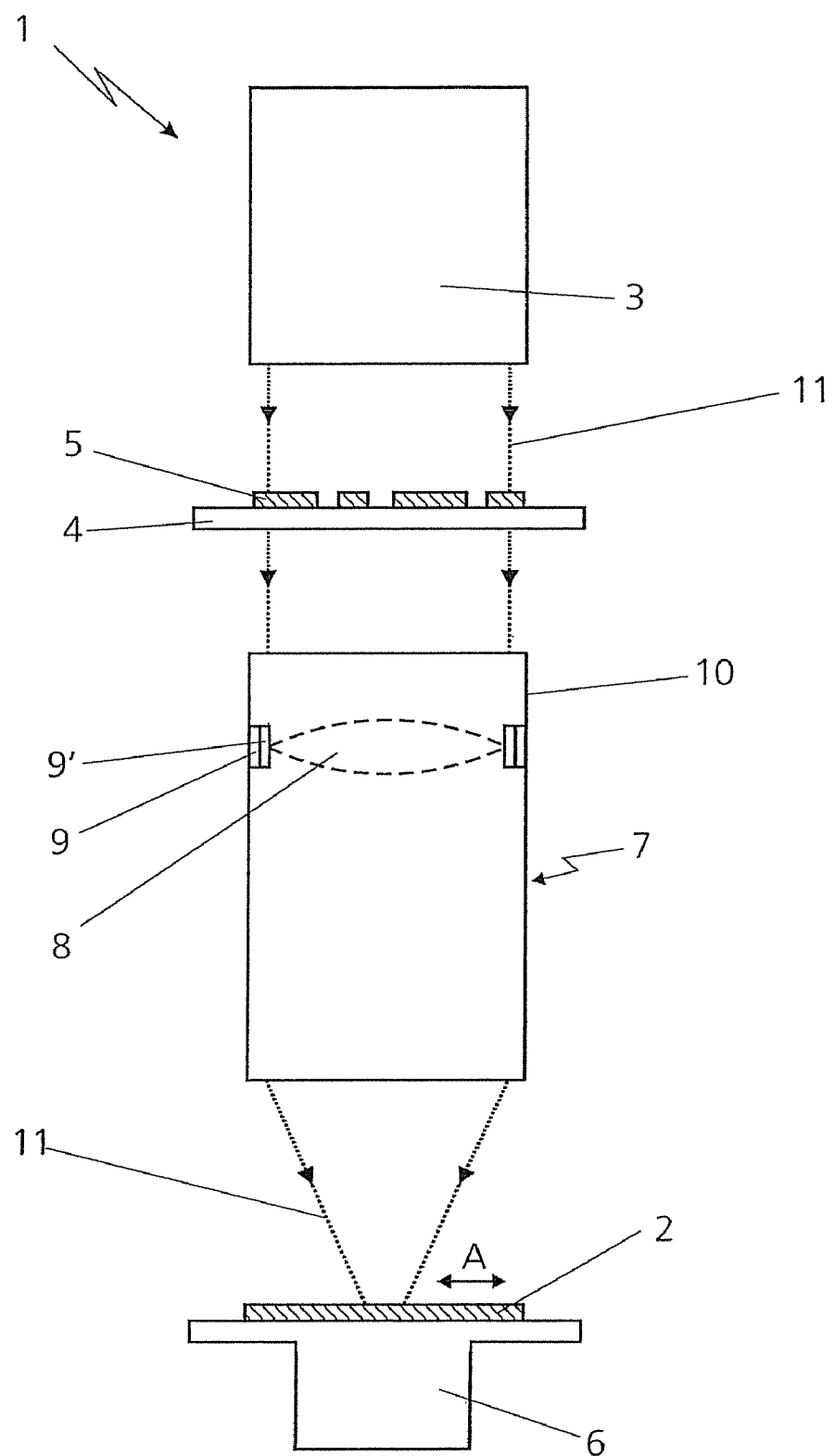
FIG. 1 shows a schematic representation of a projection exposure machine for microlithography which can be used to expose structures on wafers coated with photosensitive materials.

FIG. 1 illustrates a projection exposure machine 1 for microlithography. This serves for exposing structures on a substrate coated with photosensitive materials and which in general overwhelmingly comprises silicon and is denoted as a wafer 2 for fabricating semiconductor components such as, for example, computer chips.

The projection exposure machine 1 essentially comprises in this case an illumination device 3, a device 4 for accommodating and exactly positioning a mask provided with a grid-like structure, a so-called reticle 5 which is used to determine the later structures on the wafer 2, a device 6 for holding, moving and exactly positioning this very wafer 2, and an imaging device, specifically a projection objective 7 with a number of optical elements such as, for example, lenses 8, which are supported by mounts 9 and/or manipulators 9' in an objective housing 10 of the projection objective 7.

The fundamental functional principle provides in this case that the structures introduced into the reticle 5 are imaged in a demagnified fashion onto the wafer 2.

After exposure has been performed, the wafer 2 is moved on so that a multiplicity of individual fields each having the structure prescribed by the reticle 5 are exposed on the same wafer 2.

The illumination device 3 provides a projection beam 11, for example light or a similar electromagnetic radiation, required for imaging the reticle 5 onto the wafer 2. A laser or the like can be used as source for this radiation. The radiation is shaped in the illumination device 3 via optical elements (not illustrated) such that when impinging onto the reticle 5 the projection beam 11 has the desired properties as regards diameter, polarization, coherence and the like. The spatial coherence is in this case a measure of the angular spectrum of the radiation in the reticle plane. This parameter can be varied by the setting of various illumination settings.

An image of the structures of the reticle 5 which are introduced is produced via the projection beam 11 and transferred onto the wafer 2 in an appropriately demagnified fashion by the projection objective 7, as already explained above. The projection objective 7 has a multiplicity of individual refractive, diffractive and/or reflective optical elements such as, for example, lenses 8, mirrors, prisms, plane-parallel plates and the like, only the lens 8 being illustrated.

After the fabrication, a concluding optimization of the manipulators of the optical elements, in particular the lenses 8, the reticle tilt/reticle height and the wavelength is essential in deciding the final image-forming quality of the projection objective 7. In this case, the image-forming quality of the projection objective is optimized, inter alia, taking account of the following aberrations: distortion, field curvature, astigmatism, coma, spherical aberration and wavefront errors of higher order.

It is known from the prior art to introduce slight changes in the optical properties by measuring parameters in the case of which the effects of the manipulation of the optical elements on these parameters are known, whereupon optimization of the parameters is carried out. As a rule, Zernike coefficients which describe the image-forming properties of the projection objective are determined for this purpose from measured values. This is achieved, for example, by measurements at a number of field points via an imaging scanner slit (=field in the image plane which is relevant to lithographical imaging). As described, for example, in EP 1 231 516 A2, Zernike coefficients with designations $Z_2$ to $Z_{37}$ are determined in this way, after which the optimization is performed. For this purpose, the average root-mean-square deviation of all the measured field points from 0 is minimized for each Zernike coefficient (so-called least square optimization). Subsequently, the Zernike coefficients $Z_2$ to $Z_9$ are represented by their corresponding function terms. Zernike coefficients of higher order are described in EP 1 231 516 A2.

| Zernike coefficient $Z_n$ | Function term $f_n$ |
| --- | --- |
| $Z_2$ | $\rho \times \cos(\phi)$ |
| $Z_3$ | $\rho \times \sin(\phi)$ |
| $Z_4$ | $2 \times \rho^2 - 1$ |
| $Z_5$ | $\rho^2 \times \cos(2\phi)$ |
| $Z_6$ | $\rho^2 \times \sin(2\phi)$ |
| $Z_7$ | $(3\rho^3 - 2\rho) \times \cos(\phi)$ |
| $Z_8$ | $(3\rho^3 - 2\rho) \times \sin(\phi)$ |
| $Z_9$ | $6\rho^4 - 6\rho^2 + 1$ |

It is likewise known to use these Zernike coefficients to find the relationship between the objective properties and the lithographic process. Assuming sufficiently small aberrations, this can be accomplished in many cases with the aid of a linear model:

$$L_i = a_2 \times Z_2(i) + a_3 \times Z_3(i) + \ldots + a_n \times Z_n(i)$$

The weighted sum can be truncated after a sufficient number of terms, since in most cases the weighting factors become small very rapidly with rising Zernike number n. Of course, it is also possible to include square terms or terms of even higher order. The weighting factors an can be determined experimentally or by simulation.

The variable $L_i$ describes a parameter of the lithographic process at the field point i. $L_i$ can be, for example, a horizontal offset of a structure relative to its ideal position (distortion), or else the deviation from an ideal line width.

The fabrication or optimization of a projection objective 7 firstly requires knowledge of the critical lithographic process for which the projection objective 7 is later to be used. It is then possible to calculate the appropriate weighting factors $a_n$ for various Zernike coefficients from this information. Maximum absolute values can then be derived for various Zernike coefficients from the prescription as to how far various $L_i$ may be maximized.

During optimization of the projection objective 7, various Zernike coefficients are then minimized at various field points, it being possible for these also to be various $L_i$ in a specific instance. Projection objectives 7 are then also usually specified such that various Zernike coefficients and/or various $L_i$ may not exceed a maximum absolute value for a specific number of field points. It is thereby ensured that the image-forming properties of the projection objective 7 suffice for a representative selection of lithographic processes.

Figure 2:
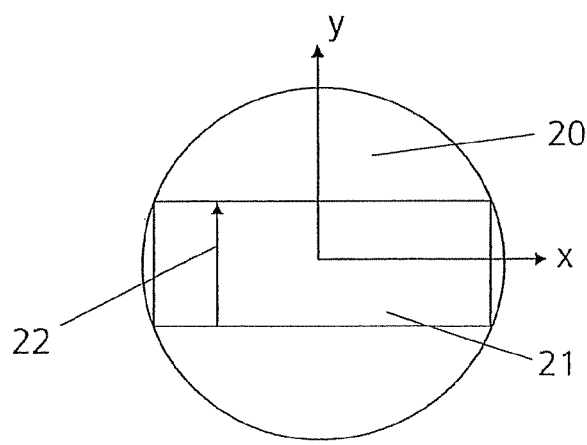
FIG. 2 shows an illustration of a scanner slit within a full image plane of a projection objective.

FIG. 2 shows the round full image field 20 of the projection objective 7. All the points on the reticle 5 which lie within this region can be imaged onto the wafer 2 with the aid of the projection objective 7. When the projection exposure machine 1 is used as scanner, it is only a rectangular section, the so-called scanner slit 21, from the full image field 20 that is used. During a lithographic exposure with the aid of a scanner, the reticle 5 and the wafer 2 are moved simultaneously during imaging in a plane perpendicular to the optical axis. The consequence of this is that a point on the reticle 5 is imaged by various field points of the projection objective 7. The aberrations relevant to this imaging are therefore the aberrations of all the field points which lie on a straight line in the scanner slit 21 which is orientated in the scanning direction (indicated by arrow 22). In order to describe the image-forming properties of the projection objective 7 in a scanner, the relevant parameters such as, for example, Zernike coefficients, are not specified for individual field points, but averaged over all the field points in the scanning direction. It is also possible to introduce a weighting during this averaging in order to take account of different intensities of illumination in the course of the scanning operation. The parameters averaged in such a way are referred to as being scanner integrated.

FIGS. 3 to 7 illustrate profiles of Zernike coefficients $Z_2$ and $Z_7$ over a number of field points which describe the aberrations and which, for their part, are determined at various field points in the scanner slit 21 of the projection objective 7. Plotted respectively on the x-axis is the x-position in the scanner slit 21, while the y-axis respectively specifies the y-deviation of the respective Zernike coefficient from 0 in nm.

Various manipulators of the projection objective 7 are moved during the optimization of the image-forming properties. These manipulators can be subdivided into two classes with the aid of the symmetry of the induced aberrations:

1. Manipulators for optimizing tunable aberrations: Tunable aberrations are changes in various Zernike coefficients at various field points, the induced changes being invariant under an arbitrary rotation about the optical axis (z-axis). The following come into consideration in this case as manipulators:
   displacement of lenses 8 or reticle 5 along the optical axis;
   change in temperature and atmospheric pressure;
   change in wavelength; and
   change in the composition of the purge gas surrounding the lenses 8.

2. Manipulators for optimizing centrable aberrations:
Centrable aberrations are changes in various Zernike coefficients at various field points, the induced changes in the plane perpendicular to the optical axis having a marked axis of symmetry. The following come into consideration in this case as manipulators:
   displacement of lenses 8 perpendicular to the optical axis; and
   tilting of lenses 8 or reticle 5 about an axis perpendicular to the optical axis.

It is known from the Seidel aberration theory that small changes in tunable aberrations always have the same field distribution for a specific Zernike coefficient. This fundamental "shape" of the aberrations is independent of the type of manipulator. An equivalent theoretical model exists for centrable aberrations.

The following table shows the tunable and centrable aberrations of lowest order, the tunable aberrations presented here corresponding to the third order Seidel aberrations. The centrable aberrations refer in this case to an x-decentering, this corresponding, however, to a displacement of the lens 8 along the x-axis. For decenterings along another axis, it is necessary to rotate the field profiles (with coordinates r, φ in the field for lithographic imaging) correspondingly.

| Zernike coefficient $Z_n$ | Type of aberration | Tunable profile | Centrable profile |
| --- | --- | --- | --- |
| $Z_2$ | distortion | $r \times \cos(\phi)$ | $r^2$ |
| $Z_3$ | distortion | $r \times \sin(\phi)$ | |
| $Z_4$ | image surface | $r^2$ | |
| $Z_5$ | astigmatism | $r^2 \times \cos(\phi)$ | $r \times \cos(\phi)$ |
| $Z_6$ | astigmatism | $r^2 \times \sin(\phi)$ | $r \times \sin(\phi)$ |
| $Z_7$ | coma | $r \times \cos(\phi)$ | $r^0$ |
| $Z_8$ | coma | $r \times \sin(\phi)$ | |
| $Z_9$ | spherical aberration | $r^0$ | $r \times \cos(\phi)$ |

Figure 3:
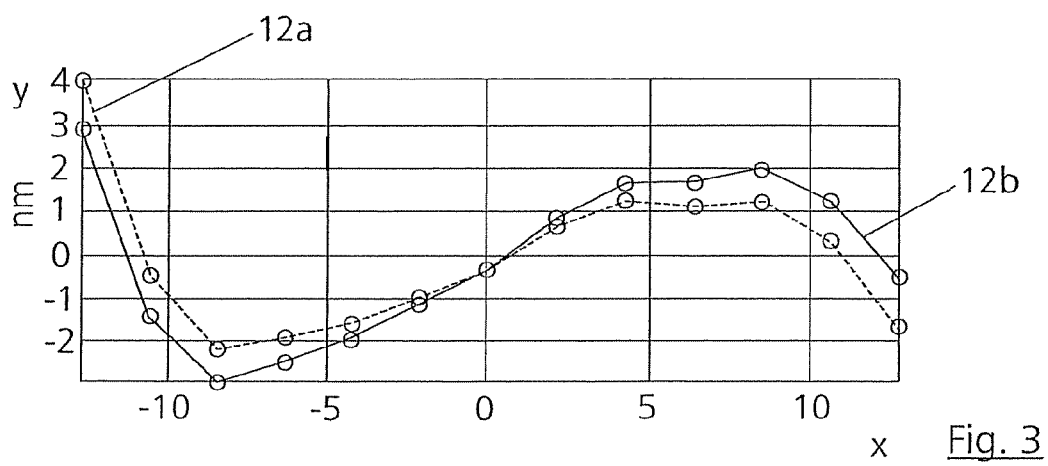
FIG. 3 shows a graph of a Zernike coefficient $Z_7$ after a tilt optimization with the aid of z-manipulators.

As an example, FIG. 3 shows a profile of a Zernike coefficient $Z_7$ of a projection objective 7. The tilt of this profile can be set by z-manipulators. In accordance with the prior art, the optimum tilt is achieved by means of a least square optimization, that is to say the root-mean-square value of the Zernike coefficient $Z_7$ is minimized over all the field points. When, however, the field maximum (=maximum absolute value of a Zernike coefficient at all the field points in the scanner slit 21) is used to specify the projection objective 7, it is advantageous for precisely this field maximum to be set as small as possible. This is achieved by means of a nonlinear min-max optimization.

As may be seen from FIG. 3, the field maximum in accordance with a least square optimization (curve 12a) can be substantially larger than in accordance with a min-max optimization (curve 12b). The inventor has established that performance with regard to the Zernike coefficients $Z_7$ and $Z_9$ can be improved by more than half a nanometer in a significant number of cases for the projection objectives 7 solely by changing from least square optimization to min-max optimization. It was possible here for the field maximum to be lowered from 4.06 nm (least square optimization) to 2.92 nm (min-max optimization).

Figure 4:
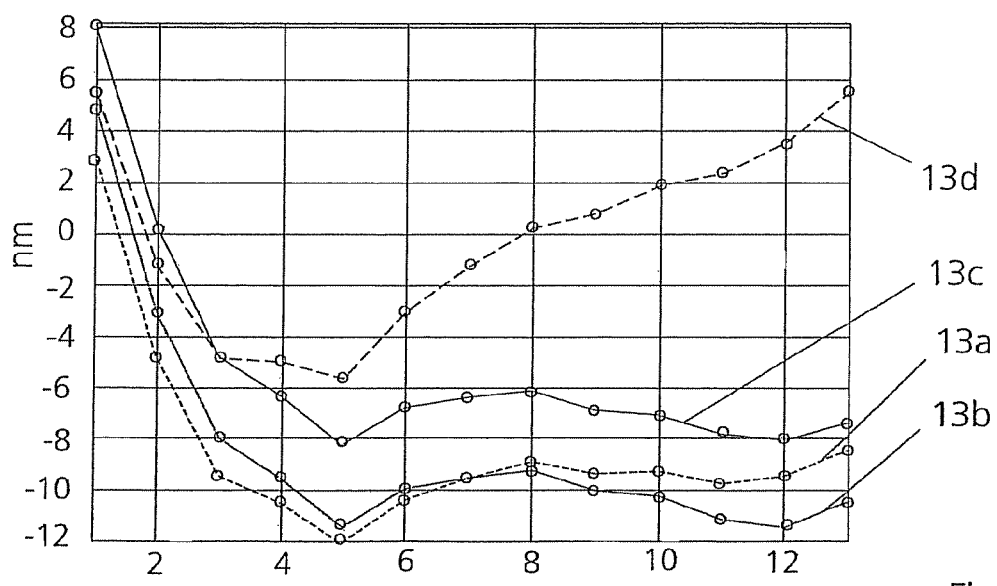
FIG. 4 shows a graph of a profile of an optimization of an astigmatism aberration.

FIG. 4 shows a joint optimization of centrable and tunable aberrations. The joint optimization of centrable and tunable aberrations on the projection objective 7 instead of a sequential procedure additionally permits a more accurate and speedy optimization of the optical image-forming properties of the projection objective 7. A profile of a Zernike coefficient $Z_7$ (coma) whose tunable component (tilt) and centrable component (offset) are minimized with the aid of a min-max optimization was selected as an example. The simultaneous optimization of tilt and offset here delivers a substantially better result than the sequential min-max optimization of tunable aberrations with the aid of z-manipulators, and subsequent optimization of centrable aberrations with the aid of xy-manipulators. A curve 13a shows the uncorrected $Z_7$ profile here. A curve 13b is the $Z_7$ profile with optimized tilt. A curve 13c shows the $Z_7$ profile with optimized tilt and offset (optimized sequentially one after another). As may further be seen from FIG. 4, a simultaneous optimization of the field maximum with the aid of z-manipulators (tilt) and xy-manipulators (offset) is the most advantageous (curve 13$d$), in which case the field maximum of 8.2 nm can be lowered to 5.6 nm in contrast with the sequential method.

Figure 5:
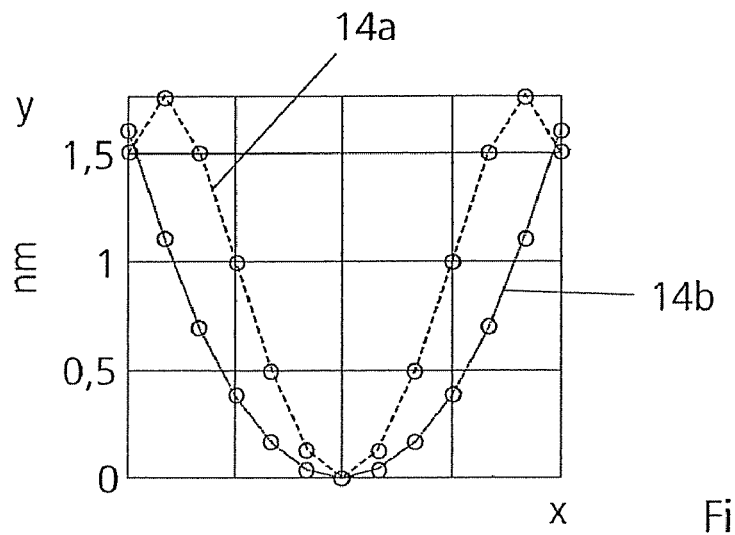
FIG. 5 shows a graph of a profile of a Zernike coefficient $Z_2$ with and without joint optimization of reticle tilt and xy-manipulation.
Figure 6:
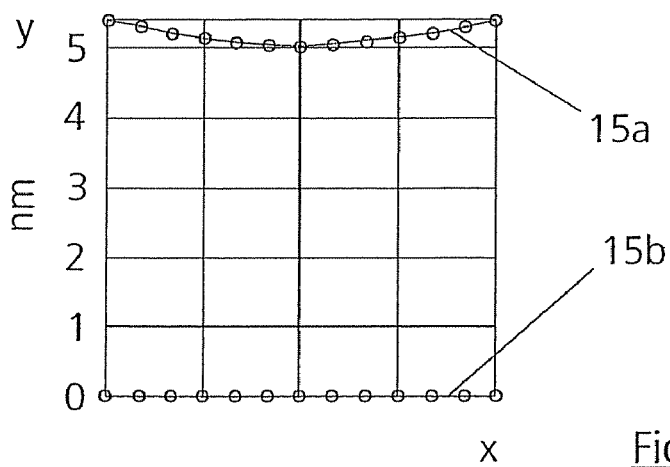
FIG. 6 shows a graph of a profile of a Zernike coefficient $Z_7$ with and without joint optimization of reticle tilt and xy-manipulation.
Figure 7:
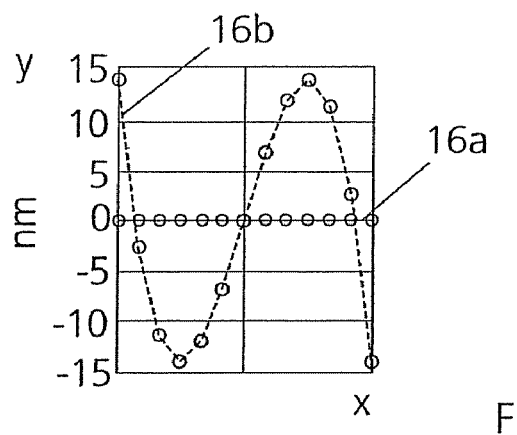
FIG. 7 shows a graph of a distortion for annular and for coherent illumination setting.

FIG. 5 shows the effect of a reticle tilt (curve 14$a$) or of a movement of the xy manipulator (curve 14$b$) on a profile of the Zernike coefficient $Z_2$-FIG. 6 shows the effect of a reticle tilt (curve 15$b$) or of a movement of the xy manipulator (curve 15$a$) on a $Z_7$ profile. A $Z_2$ offset, which corresponds to the curve 14$a$, could be removed in the case of the above-described scenario by means of a reticle tilt. However, when the $Z_7$ offset corresponding to the curve 15$a$ is removed by the xy-manipulator in a second step, a $Z_2$ error is introduced again into the objective (curve 14$b$). In the case of a 10 nm $Z_7$ offset, this would result nevertheless in an additional $Z_2$ error of more than 3 nm. This could be avoided by means of an orthogonalized concept of xy-manipulators and reticle tilt, for which purpose it would be necessary to treat the reticle tilt like any other xy-manipulator.

It is advantageous to apply a distortion optimization dependent on the illumination setting of the projection objective 7. The distortion values can be substantially improved in specific cases by tracking the manipulators during changing of the illumination setting (for example from annular to coherent). A geometrical distortion ($Z_2$) is usually not optimized, but a combination of geometrical distortion and coma-induced distortion. All the scanner-integrated Zernike coefficients vanish here, with the exception of $Z_7$, the $Z_7$ profile including higher tunable components. In the case of the present optimization with the aid of z-manipulators, a $Z_2$-component in the projection objective 7 is then increased so that the resulting distortion results in an annular illumination setting of 0 (curve 16$a$ in FIG. 7). In the event of a change in setting from annular to coherent, however, the result in this case is distortion values of up to approximately 15 nm (curve 16$b$). It is therefore proposed according to the invention to track the xy- and z-manipulators (including wavelength and reticle) during each change in illumination setting.

What is claimed is:

1. A method for adjusting a projection objective of a projection exposure machine of the type used for microlithography in the fabrication of semiconductor components and having an illumination device for providing an illumination beam and a plurality of optical elements in the path of the illumination beam for projecting an image onto a substrate, a characteristic of the projection objective being capable of being adjusted to alter aberrations of the projection objective, said method comprising:
   (a) specifying a set of parameters, each of said parameters in said set of parameters representing a respective imaging property of the projection objective, each of said parameters in said set of parameters having an absolute value at each of a plurality of points in a field of an image plane of the projection objective, said set of parameters comprising a first parameter;
   (b) determining a condition relating to said absolute values of said first parameter; and
   (c) after (b), adjusting said characteristic of said projection objective to satisfy said condition relating to said absolute values of said first parameter, said imaging property being an imaging property selected from the group consisting of distortion and line width.

2. The method of claim 1 wherein said condition is a condition requiring reduction of the absolute value of each parameter in said set at the one of said plurality of points in said field at which said absolute value is a maximum.

3. The method of claim 1 wherein said condition is a condition requiring minimization of the absolute value of each parameter in said set at the one of said plurality of points in said field at which said absolute value is a maximum.

4. The method of claim 1 wherein (c) comprises carrying out a nonlinear numerical method.

5. The method of claim 1 wherein one of said absolute values is a maximum of all of said absolute values of all of said parameters and said condition is a condition requiring reduction of said maximum of all of said absolute values of all of said parameters.

6. The method of claim 1 wherein one of said absolute values is a maximum of all of absolute values of all of said parameters and said condition is a condition requiring minimization of all of said absolute values of all of said parameters.

7. The method of claim 1 further comprising changing an illumination setting of the illumination device after (c), and thereafter repeating (c).

8. The method of claim 7 wherein said illumination setting comprises a setting selected from the group consisting of a coherence setting, a diameter setting, and a polarization setting.

9. The method of claim 1 wherein at least one of said parameters comprises individual Zernike coefficients describing wave aberrations of an objective pupil of the projection objective.

10. The method of claim 1 wherein at least one of said parameters comprises a linear combination of Zernike coefficients.

11. The method of claim 1 wherein at least one of said parameters comprises an average of Zernike coefficients over a plurality of field points lying within a portion of the image plane defined by a scanner slit, said plurality of points lying along a line oriented in a scanning direction.

12. The method of claim 11 wherein said average is a weighted average.

13. The method of claim 1 wherein said set of parameters includes at least one parameter describing a centrable aberration, and adjusting said characteristic of the projection objective comprises tilting a reticle of the projection objective to adjust for said centrable aberration.

14. The method of claim 13 wherein adjusting said characteristic of the projection objective comprises at least one of the following steps:
   (i) displacing at least one of the optical elements in a direction perpendicular to an optical axis of the projection objective; and
   (ii) tilting at least one of the optical elements in a direction perpendicular to said optical axis of the projection objective.

15. The method of claim 13 wherein said set of parameters further includes at least one parameter describing a tunable aberration, and adjusting said characteristic of the projection objective comprises adjusting at least one of the optical elements to adjust for said tunable aberration and said centrable aberration jointly.

16. The method of claim 15, wherein adjusting said characteristic of the projection objective comprises at least one of the following steps:
   (i) displacing at least one of the optical elements in a direction along the optical axis of the projection objective;
   (ii) changing a wavelength of illumination of the projection objective;

(iii) changing a temperature within the projection objective;

(iv) changing an air pressure within the projection objective, and (v) changing a composition of a purge gas surrounding the optical elements.

17. The method of claim 1, wherein adjusting said characteristic of the projection objective comprises at least one member selected from the group consisting of:
displacing at least one of said optical elements;
tilting at least one of said optical elements;
tilting a reticle;
changing a wavelength of illumination of said projection objective;
changing a temperature within said projection objective;
changing an air pressure within said projection objective; and
changing a composition of a purge gas surrounding said optical elements.

18. The method of claim 1, wherein adjusting said characteristic of said projection objective adjusting comprises displacing at least one of said optical elements.

19. The method of claim 1, wherein adjusting said characteristic of said projection objective comprises displacing at least one of said optical elements in a direction perpendicular to an optical axis of said projection objective.

20. The method of claim 1, wherein adjusting said characteristic of said projection objective comprises displacing at least one of said optical elements in a direction along the optical axis of said projection objective.

21. The method of claim 1, wherein adjusting said characteristic of said projection objective comprises tilting at least one of said optical elements.

22. The method of claim 1, wherein adjusting said characteristic of said projection objective comprises tilting at least one of said optical elements in a direction perpendicular to said optical axis of said projection objective.

23. The method of claim 1, wherein adjusting said characteristic of said projection objective comprises tilting a reticle.

24. The method of claim 1, wherein adjusting said characteristic of said projection objective comprises changing a wavelength of illumination of said projection objective.

25. The method of claim 1, wherein adjusting said characteristic of said projection objective comprises changing a temperature within said projection objective.

26. The method of claim 1, wherein adjusting said characteristic of said projection objective comprises changing an air pressure within said projection objective.

27. The method of claim 1, wherein adjusting said characteristic of said projection objective comprises changing a composition of a purge gas surrounding said optical elements.

28. The method of claim 4, wherein said condition is a condition requiring reduction of the absolute value of each parameter in said set at the one of said plurality of points in said field at which said absolute value is a maximum.

29. The method of claim 4, wherein said condition is a condition requiring minimization of the absolute value of each parameter in said set at the one of said plurality of points in said field at which said absolute value is a maximum.

30. The method of claim 4, wherein one of said absolute values is a maximum of all of said absolute values of all of said parameters and said condition is a condition requiring reduction of said maximum of all of said absolute values of all of said parameters.

31. The method of claim 4, wherein one of said absolute values is a maximum of all of said absolute values of all of said parameters and said condition is a condition requiring minimization of said maximum of all of said absolute values of all of said parameters.

32. The method of claim 4, wherein adjusting said characteristic of the projection objective comprises at least one member selected from the group consisting of:
displacing at least one of said optical elements;
tilting at least one of said optical elements;
tilting a reticle;
changing a wavelength of illumination of said projection objective;
changing a temperature within said projection objective;
changing an air pressure within said projection objective; and
changing a composition of a purge gas surrounding said optical elements.

33. The method of claim 4, wherein adjusting said characteristic of said projection objective adjusting comprises displacing at least one of said optical elements.

34. The method of claim 4, wherein adjusting said characteristic of said projection objective comprises displacing at least one of said optical elements in a direction perpendicular to an optical axis of said projection objective.

35. The method of claim 4, wherein adjusting said characteristic of said projection objective comprises displacing at least one of said optical elements in a direction along the optical axis of said projection objective.

36. The method of claim 4, wherein adjusting said characteristic of said projection objective comprises tilting at least one of said optical elements.

37. The method of claim 4, wherein adjusting said characteristic of said projection objective comprises tilting at least one of said optical elements in a direction perpendicular to said optical axis of said projection objective.

38. The method of claim 4, wherein adjusting said characteristic of said projection objective comprises tilting a reticle.

39. The method of claim 4, wherein adjusting said characteristic of said projection objective comprises changing a wavelength of illumination of said projection objective.

40. The method of claim 4, wherein adjusting said characteristic of said projection objective comprises changing a temperature within said projection objective.

41. The method of claim 4, wherein adjusting said characteristic of said projection objective comprises changing an air pressure within said projection objective.

42. The method of claim 4, wherein adjusting said characteristic of said projection objective comprises changing a composition of a purge gas surrounding said optical elements.

\* \* \* \* \*

UNITED STATES PATENT AND TRADEMARK OFFICE
CERTIFICATE OF CORRECTION

| | | |
|---|---|---|
| PATENT NO. | : 7,965,377 B2 | Page 1 of 1 |
| APPLICATION NO. | : 12/060543 | |
| DATED | : June 21, 2011 | |
| INVENTOR(S) | : Wolfgang Emer | |

It is certified that error appears in the above-identified patent and that said Letters Patent is hereby corrected as shown below:

<u>Column 4,</u>
Line 57, Delete "an" and insert --$a_n$--

<u>Column 7,</u>
Line 9, Delete "$Z_2$-FIG.6" and insert --$Z_2$. FIG. 6--

Signed and Sealed this

Twenty-third Day of August, 2011

David J. Kappos
*Director of the United States Patent and Trademark Office*